United States Patent
Okumura et al.

(10) Patent No.: US 6,995,757 B2
(45) Date of Patent: Feb. 7, 2006

(54) LEVEL CONVERTER CIRCUIT AND A LIQUID CRYSTAL DISPLAY DEVICE EMPLOYING THE SAME

(75) Inventors: Haruhisa Okumura, Chiba (JP); Yukihide Ode, Mobara (JP)

(73) Assignees: Hitachi, Ltd., Tokyo (JP); Hitachi Device Engineering Co., Ltd., Chiba-ken (JP)

( * ) Notice: Subject to any disclaimer, the term of this patent is extended or adjusted under 35 U.S.C. 154(b) by 363 days.

(21) Appl. No.: 10/460,154

(22) Filed: Jun. 13, 2003

(65) Prior Publication Data

US 2004/0004593 A1    Jan. 8, 2004

Related U.S. Application Data

(63) Continuation of application No. 09/780,492, filed on Feb. 12, 2001, now Pat. No. 6,593,920.

(30) Foreign Application Priority Data

Feb. 24, 2000    (JP) .............................. 2000-047164

(51) Int. Cl.
   *G09G 5/00*    (2006.01)
(52) U.S. Cl. .................... 345/204; 345/211; 345/98
(58) Field of Classification Search ........ 345/204–214, 345/87–104; 326/68, 81, 83, 114; 327/333, 327/384
   See application file for complete search history.

(56) References Cited

U.S. PATENT DOCUMENTS

| | | | |
|---|---|---|---|
| 3,801,831 A | * | 4/1974 | Dame .......................... 326/81 |
| 5,498,991 A | * | 3/1996 | Tanoi .......................... 327/333 |
| 5,502,406 A | | 3/1996 | Traynor et al. |
| 5,646,642 A | | 7/1997 | Maekawa et al. |
| 5,677,641 A | * | 10/1997 | Nishio et al. ................ 326/121 |
| 6,034,549 A | * | 3/2000 | Matsumoto et al. .......... 326/68 |
| 6,081,131 A | | 6/2000 | Ishii |
| 6,107,857 A | | 8/2000 | Orisaka et al. |

FOREIGN PATENT DOCUMENTS

| | | |
|---|---|---|
| JP | 04-242319 | 1/1991 |
| JP | 5-113771 | 10/1991 |
| JP | 06-037624 | 7/1992 |
| JP | 06-204850 | 1/1993 |

* cited by examiner

*Primary Examiner*—Alexander Eisen
(74) *Attorney, Agent, or Firm*—Reed Smith LLP; Stanley P. Fisher, Esq.; Juan Carlos A. Marquez, Esq.

(57) ABSTRACT

A level converter circuit includes an input terminal adapted to be supplied with a signal swinging from a first voltage to a second voltage lower than the first voltage; a first transistor having a gate electrode connected to the input terminal, and a source electrode connected to ground potential; a second transistor having a gate electrode connected to a drain electrode of the first transistor, a source electrode connected to a supply voltage, and a drain electrode connected to an output terminal; a load circuit connected between the gate electrode of the second transistor and the supply voltage; a third transistor having a source electrode connected to the input terminal, a drain electrode connected to the output terminal, and a gate electrode supplied with a DC voltage higher than the second voltage and lower than the first voltage. The level converter circuit outputs a third voltage higher than the second voltage when the input terminal is supplied with the first voltage, and the level converter circuit outputs the second voltage when the input terminal is supplied with the second voltage.

5 Claims, 16 Drawing Sheets

FIG. 18A
FIG. 18B
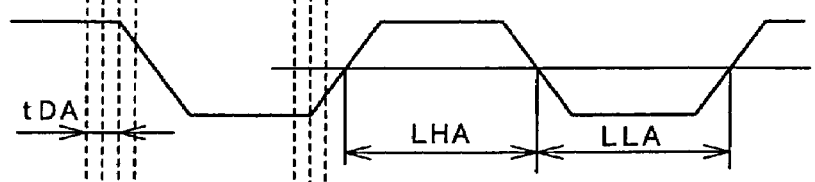
FIG. 18C
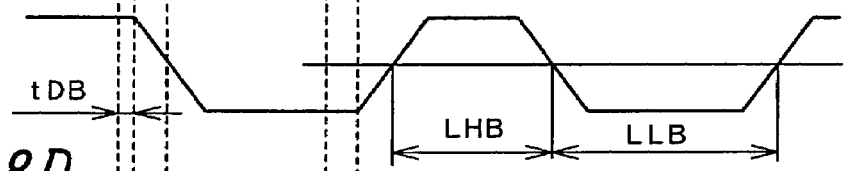
FIG. 18D
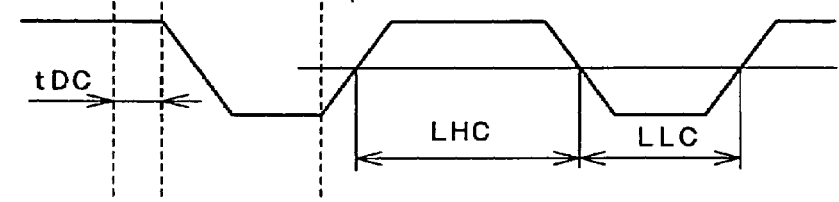

LEVEL CONVERTER CIRCUIT AND A LIQUID CRYSTAL DISPLAY DEVICE EMPLOYING THE SAME

This application is a continuation application of U.S. application Ser. No. 09/780,492 filed on Feb. 12, 2001, now U.S. Pat. No. 6,593,920.

BACKGROUND OF THE INVENTION

The present invention relates to a level converter circuit and a liquid crystal display device employing the level converter circuit, and in particular to a level converter circuit formed by polysilicon transistors.

Liquid crystal display modules of the STN (Super Twisted Nematic) type or the TFT (Thin Film Transistor) type are widely used as a display device for a notebook personal computer and the like. Some driver circuits for driving such liquid crystal display panels need a level converter circuit external to the liquid crystal display panel. Such a level converter circuit is disclosed in Japanese Patent Application Laid-open No. Hei 6-204,850 (laid-open on Jul. 22, 1994), for example.

FIG. 13 is a circuit diagram of an example of a prior art level converter circuit. The level converter circuit shown in FIG. 13 is formed by MOS transistors using single crystal silicon for their semiconductor layers, and is of the same circuit configuration as that shown in FIG. 4 of Japanese Patent Application Laid-open No. Hei 6-204,850.

The level converter circuit shown in FIG. 13 has a CMOS inverter INV1 to which a low-voltage input signal φ1 is supplied and a CMOs inverter INV2 to which an output signal φ2 from the CMOS inverter INV1 is supplied.

The CMOS inverter INV1 is formed by a p-channel MOS transistor (hereinafter referred to as a PMOS) M5 and an n-channel MOS transistor (hereinafter referred to as an NMOS) M6 which are connected in series between a low voltage VCC and a reference voltage (or ground potential) Vss.

The CMOS inverter INV2 is formed by a PMOS M7 and an NMOS M8 which are connected in series between the low voltage VCC and the reference voltage (or ground potential) Vss.

Further, the level converter circuit includes a series combination of a PMOS M9 and an NMOS M11 and a series combination of a PMOS M10 and an NMOS M12, which are connected between a high voltage VDD and the reference voltage VSS.

An output signal φ3 from the CMOS inverter INV2 is supplied to a gate electrode of the NMOS M11, and an output signal φ2 from the CMOS inverter INV1 is supplied to a gate electrode of the NMOS M12. A gate electrode of the PMOS M9 is connected to a drain electrode of the PMOS M10, and a gate electrode of the PMOS M10 is connected to a drain electrode of the PMOS M9.

The input signal φ1 supplied via an input terminal VIN has an amplitude between the low voltage VCC and the reference voltage VSS, and is converted into the low voltage outputs φ2 and φ3 each having amplitudes between the low voltage VCC and the reference voltage VSS.

The low voltage output signals φ2 and φ3 are supplied to gate electrodes of the NMOS M11 and the NMOS M12, respectively, and outputs from output terminals VOUT1 and VOUT2 are two level-converted signals, that is, two complementary output signals φ4 and φ5 having amplitudes between the high supply voltage VDD and ground potential VSS, respectively.

For example, suppose that the low voltage output signal φ2 is at a high level (hereafter referred to merely as an H level) and the low voltage output signal φ3 is at a low level (hereafter referred to merely as an L level). Then the NMOS M12 is ON, PMOS M9 is ON, NMOS M11 is OFF, and PMOS M10 is OFF, and therefore the output terminal VOUT2 outputs the ground potential VSS and the output terminal VOUT1 outputs the high voltage VDD.

Next, suppose that the low voltage output signal φ2 is at the L level and the low voltage output signal φ3 is at the H level. Then the NMOS M12 is OFF, the PMOS M9 is OFF, the NMOS M11 is ON, and the PMOS M10 is ON, and therefore the output terminal VOUT2 outputs the high supply voltage VDD and the output terminal VOUT1 outputs the ground potential VSS.

FIG. 14 is a circuit diagram of another example of a prior art level converter circuit. The level converter circuit shown in FIG. 14 is also formed by MOS transistors using single crystal silicon for their semiconductor layers, and is of the same circuit configuration as that shown in FIG. 1 of Japanese Patent Application Laid-open No. Hei 6-204,850.

The level converter circuit shown in FIG. 14 differs from that shown in FIG. 13, in that the CMOS inverter INV2 is omitted, the output signal φ2 from the CMOS inverter INV1 is supplied to the source electrode of the NMOS M11, and the gate of which is supplied with the low voltage VCC.

In the level converter circuit shown in FIG. 13, when the level-converted output signals φ4, φ5 from the output terminals VOUT1, VOUT2 change from the H level to the L level, or from the L level to the H level, all of the PMOS M9, the NMOS M11, the PMOS M10 and the NMOS M12 are turned ON simultaneously, and consequently, currents flow through a series combination of the PMOS M9 and the NMOS M11 and a series combination of the PMOS M10 and the NMOS M12, respectively. The level converter circuit shown in FIG. 14 is configured so as to prevent such currents from flowing through the series combination of the PMOS M9 and the NMOS M11 and the series combination of the PMOS M10 and the NMOS M12.

The level converter circuit shown in FIG. 13 needs a total of eight MOS transistors comprising four MOS transistors M5 to M8 in the low-voltage circuit and four MOS transistors M9 to M12 in the high-voltage circuit, the level converter circuit shown in FIG. 14 needs six MOS transistors, and therefore the prior art level converter circuits had the problem in that many MOS transistors are needed.

It is known that mobility in MOS transistors using as their semiconductor layers, single crystal silicon, polysilicon and amorphous silicon are 1,000 to 2,000 $cm^2/(V \cdot s)$, 10 to 100 $cm^2/(V \cdot s)$, and 0.1 to 10 $cm^2/(V \cdot s)$, respectively. MOS transistors using as their semiconductor layers, polysilicon and amorphous silicon are capable of being fabricated on a transparent insulating substrate made of quartz glass or glass having a softening temperature not higher than 800° C., and therefore electronic circuits can be fabricated directly on a display device such as a liquid crystal display device.

FIG. 15 is a graph showing an example of switching characteristics of an n-channel MOS transistor having a semiconductor made of single crystal silicon, and FIG. 16 is a graph showing an example of switching characteristics of an n-channel MOS transistor having a semiconductor layer made of polysilicon.

In FIGS. 15 and 16, curves A represent characteristics for a standard threshold VTH, curves B represent characteristics for a threshold voltage VTH shifted by −1 V from the standard threshold voltage, and curves C represent characteristics for a threshold voltage VTH shifted by +1 V from the standard threshold voltage.

As is understood from FIGS. 15 and 16, in the case of the polysilicon MOS transistor (a polysilicon thin film transistor, for example) using as a semiconductor layer a polysilicon obtained by a solid phase epitaxy method crystallizing at a temperature of 500° C. to 1,100° C., or a polysilicon obtained by crystallizing by laser-annealing amorphous silicon produced by a CVD method, when a gate-source voltage VGS is small (5 V or less), drain currents ID of the polysilicon MOS transistor is smaller than those of the MOS transistor having the semiconductor layer of single crystal silicon, and drain currents ID of the polysilicon MOS transistor vary greatly with variations of the threshold voltages VTH.

As a result, when the level converter circuits shown in FIGS. 13 and 14 are formed by MOS transistors having semiconductor layers made of single crystal silicon, satisfactory operation can be guaranteed, but when the level converter circuits shown in FIGS. 13 and 14 are formed by polysilicon MOS transistors having semiconductor layers made of polysilicon, there was a disadvantage that sufficient driving capability could not be obtained in a case where the supply voltage is the low voltage VCC.

FIG. 17 is a graph showing DC transfer characteristics of a CMOS inverter.

In general, in a CMOS inverter, threshold voltages VTH are determined in the p-channel MOS transistors and the N-channel MOS transistors forming the CMOS inverter such that, when an input signal exceeds the middle between the H level and the L level of the input signals, the p-channel and N-channel MOS transistors forming the CMOS inverter change from ON to OFF, or from OFF to ON. Curve A in FIG. 17 represent the DC transfer characteristic in this state.

Curve B in FIG. 17 represents a DC transfer characteristic in a case where the threshold voltages VTH of the p-channel and N-channel MOS transistors forming the CMOS inverter is shifted to the left of the curve A, and curve C in FIG. 17 represents a DC transfer characteristic in a case where the threshold voltages VTH of the p-channel and N-channel MOS transistors forming the CMOS inverter is shifted to the right of the curve A.

FIGS. 18A to 18D are schematic illustrations for explaining input and output waveforms of the CMOS inverter.

FIG. 18A represents a waveform of an input signal to the CMOS inverter, FIGS. 18B to 18D represent waveforms of output signals from the CMOS inverters having DC transfer characteristics corresponding to the curves A to C of FIG. 17, respectively.

If the DC transfer characteristic of the CMOS inverter is represented by the curve A of FIG. 17, the output signal starts to fall delayed by a time tDA from the time the input signal starts to rise, but a duration LHA of the H level and a duration LLA of the L level of the output signal are the same as durations of the H and L levels of the input signal, respectively, as shown in FIG. 18B.

But, if the DC transfer characteristic of the CMOS inverter is represented by the curve B of FIG. 17, the output signal starts to fall delayed by a time tDB which is shorter than the time tDA, from the time the input signal starts to rise, a duration LHB of the H level of the output signal is shorter than the duration of the H level of the input signal and a duration LLB of the L level of the output signal is longer than the duration of the L level of the input signal, as shown in FIG. 18C.

And, if the DC transfer characteristic of the CMOS inverter is represented by the curve C of FIG. 17, the output signal starts to fall delayed by a time tDC which is longer than the time tDA, from the time the input signal starts to rise, and a duration LHC of the H level of the output signal is longer than the duration of the H level of the input signal and a duration LLC of the L level of the output signal is shorter than the duration of the L level of the input signal, as shown in FIG. 18D.

In general, threshold voltages VTH of polysilicon MOS transistors vary more greatly than those of MOS transistors having single crystal silicon layer, and as is apparent from FIG. 16, drain currents ID vary greatly with variations of threshold voltages VTH of the polysilicon MOS transistors.

As a result, if the prior art level converter circuit is formed by polysilicon MOS transistors, the DC transfer characteristics of the CMOS inverters INV1, INV2 (see FIG. 13) vary greatly mainly due to the variations of the threshold voltages VTH of the polysilicon MOS transistors of the CMOS inverters INV1, INV2, and consequently, there was a problem in that a delay time (or a phase difference) of the output signal with respect to the input signal and a variation of a duration of the H or L level of the output signal increase.

For example, FIG. 19 shows waveforms of input and output signals of the level converter circuit of FIG. 13 formed by n-channel MOS transistors using polysilicon having mobility of about 80 cm$^2$/(V·s) and p-channel MOS transistors using polysilicon having mobility of about 60 cm$^2$/(V·s).

In FIG. 19, curve φ5 represents an output of the level converter circuit having standard threshold voltages VTH, curve φ5-1 represents an output of the level converter circuit in a case where threshold voltages VTH of the NMOS and PMOS transistors shift by −1 V, and curve φ5-2 represents an output of the level converter circuit in a case where threshold voltages VTH of the NMOS and PMOS transistors shift by +1 V.

As is apparent from FIG. 19, the delay time of the output signal with respect to the input signal and a variation of a duration of the H level of the output signal vary greatly with the variations of the threshold voltages VTH of the MOS transistors.

In a liquid crystal display module of the analog-sampling active-matrix type using polysilicon MOS transistors, such variations of the delay time of the output signal from the level converter circuit and the duration of the H level of the output signal cause a degradation in picture quality such as a picture defect in the form of a vertical line, when a half tone picture is displayed.

FIG. 20 is an illustration for explaining a principle of displaying by the liquid crystal display module of the active matrix type using polysilicon MOS transistors.

In the liquid crystal display module of the active matrix type using polysilicon MOS transistors, during one horizontal scanning period, a gate electrode line G1, for example, is selected by a scanning circuit and during this period analog video signals φsig are sampled and supplied to, . . . an (n−1)st drain electrode line, an nth drain electrode line, an (n+1)st drain electrode line, . . . , sequentially by shift scanning of shift registers SR of a horizontal scanning circuit, and this horizontal scanning is repeated the number of times equal to the number of the gate electrode lines to form a picture.

The operation of sampling the analog video signals φsig for the (n−1)st, nth and (n+1)st drain electrode lines will be explained by referring to time charts in FIG. 21.

First, voltage levels of complementary clock input signals φPL and φNL are level-converted by level converter circuits LV1 and LV2, respectively, to produce level-converted mutually complementary signals φNH and φPH.

The signal φPH and an output from one shift register SR are supplied to a NAND circuit NA1 to produce a sampling pulse φN, and the signal φNH and an output from another shift register SR are supplied to a NAND circuit NA2 to produce a sampling pulse φN+1.

The inverted pulses /φN and /φN+1 (A slant "/" is used instead of the bar "‾" to indicate an inverted signal.) of the sampling pulses φN and φN+1 drive sample-and-hold circuits SH1 and SH2 to sample time-varying analog video signals φsig sequentially and supply video signal voltages φm−1, φm and φm+1 to the (n−1)st, nth and (n+1)st drain electrode lines.

As a result, if the threshold voltages VTH of the MOS transistors of the level converter circuits LV1 and LV2 vary, the phases and the durations of the H level of the complementary signals φNH and φPH level-converted by the level converter circuits LV1 and LV2 vary, and consequently, the phases and the durations of the H level of the sampling pulses φN and φN+1 vary.

The variations of the phases and the durations of the H level of the sampling pulses φN and φN+1 cause shortening of the sampling time, sampling of a portion of the analog video signal φsig different from a portion of the analog video signal φsig intended to be sampled, or overlapping of the sampling times of the two sampling pulses φN and φN+1. These produce a ghost in an image displayed on a liquid crystal display panel, and therefore deteriorate display quality of the displayed image extremely.

In a digital-signal-input type liquid crystal display module of the active matrix type using polysilicon MOS transistors, if such level converter circuits are employed before a digital-analog converter (a D/A converter), variations of delay times occur in level converter circuits corresponding to respective data bits and consequently, a false picture is produced because some data bits are digital-to-analog converted in a state where they are inverted.

SUMMARY OF THE INVENTION

The present invention is made so as to solve the above problems with the prior art, it is an object of the present invention to provide a technique capable of operating a level converter circuit at a high speed and stably irrespective of variations of threshold voltages of transistors.

It is another object of the present invention to provide a technique capable of improving the quality of displayed images by a liquid crystal display device by using the above level converter circuit.

The above-mentioned and other objects and novel features of the present invention will be made apparent by the following description and accompanying drawings.

The following explains the representative ones of the present inventions briefly.

In accordance with an embodiment of the present invention, there is provided a level converter circuit comprising: an input terminal adapted to be supplied with a signal swinging from a first voltage to a second voltage lower than the first voltage; a first transistor having a gate electrode connected to the input terminal, and a source electrode connected to ground potential; a second transistor having a gate electrode connected to a drain electrode of the first transistor, a source electrode connected to a supply voltage, and a drain electrode connected to an output terminal; a load circuit connected between the gate electrode of the second transistor and the supply voltage; a third transistor having a source electrode connected to the input terminal, a drain electrode connected to the output terminal, and a gate electrode supplied with a DC voltage higher than the second voltage and lower than the first voltage, wherein the level converter circuit outputs a third voltage higher than the second voltage when the input terminal is supplied with the first voltage, and the level converter circuit outputs the second voltage when the input terminal is supplied with the second voltage.

In accordance with another embodiment of the present invention, there is provided a level converter circuit comprising: an input terminal adapted to be supplied with a digital signal swinging from a first voltage to a second voltage lower than the first voltage; a first transistor having a gate electrode connected to the input terminal, and a source electrode connected to ground potential; a second transistor having a gate electrode connected to a drain electrode of the first transistor, a source electrode connected to a supply voltage, and a drain electrode connected to an output terminal; a load circuit connected between the gate electrode of the second transistor and the supply voltage; a third transistor having a source electrode connected to the input terminal, a drain electrode connected to the output terminal, and a gate electrode supplied with a DC voltage higher than the second voltage and lower than the first voltage, wherein (a) when the input terminal is supplied with the first voltage, the first transistor and the second transistor are ON, and the level converter circuit outputs a third voltage higher than the first voltage; and (b) when the input terminal is supplied with the second voltage, the first transistor and the second transistor are OFF and the level converter circuit outputs the second voltage via the third transistor.

In accordance with still another embodiment of the present invention, there is provided a liquid crystal display device including a pair of substrates, a liquid crystal layer sandwiched between the pair of substrates, a plurality of pixels formed between the pair of substrates and a driver circuit for driving the plurality of pixels, the driver circuit being provided with a level converter circuit, the level converter circuit comprising: an input terminal adapted to be supplied with a digital signal swinging from a first voltage to a second voltage lower than the first voltage; a first transistor of an n-channel type having a gate electrode connected to the input terminal, and a source electrode connected to ground potential; a second transistor of a p-channel type having a gate electrode connected to a drain electrode of the first transistor, a source electrode connected to a supply voltage, and a drain electrode connected to an output terminal; a load circuit connected between the gate electrode of the second transistor and the supply voltage; a third transistor having a source electrode connected to the input terminal, a drain electrode connected to the output terminal, and a gate electrode supplied with a DC voltage, the DC voltage being such that, (a) when the source electrode of the third transistor is supplied with the second voltage, the third transistor is ON, and (b) when the source electrode of the third transistor is supplied with the first voltage, the third transistor is OFF, wherein (i) when the input terminal is supplied with the first voltage, the first transistor and the second transistor are ON, and the level converter circuit outputs a third voltage higher than the first voltage; and (ii) when the input terminal is supplied with the second voltage, the first transistor and the second transistor are OFF and the level converter circuit outputs the second voltage via the third transistor.

BRIEF DESCRIPTION OF THE DRAWINGS

In the accompanying drawings, in which like reference numerals designate similar components throughout the figures, and in which:

FIG. 18A is an illustration of a waveform of an input signal to a CMOS inverter, and FIGS. 18B to 18D are illustrations of waveforms of output signals from the CMOS inverter;

DETAILED DESCRIPTION OF THE PREFERRED EMBODIMENTS

Figure 1:
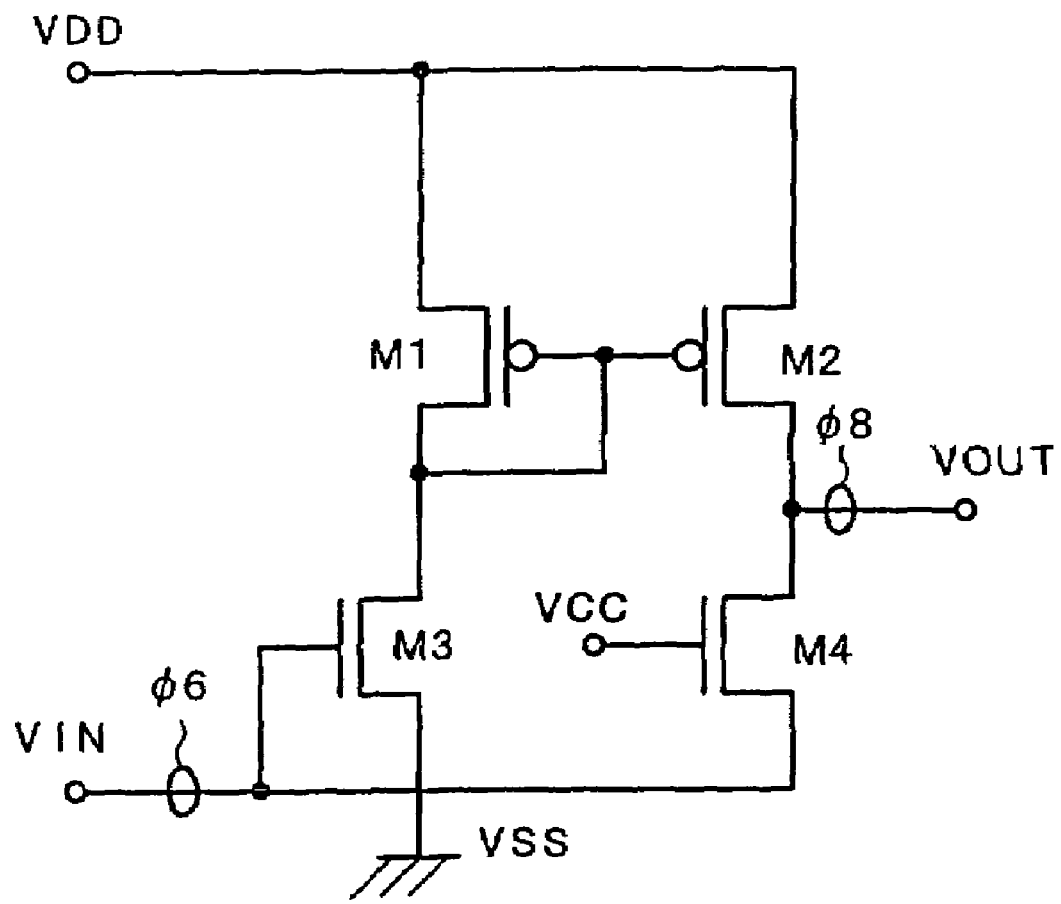
FIG. 1 is a circuit diagram of a level converter circuit of Embodiment 1 of the present invention.

The embodiments of the present invention will be explained in detail by reference to the drawings. All the drawings for the embodiments use the same reference numerals to identify parts performing the same functions, which are not repeatedly described in the specification.

Embodiment 1

FIG. 1 is a circuit diagram representing a level converter circuit of Embodiment 1 of the present invention.

As shown in FIG. 1, the level converter circuit of this embodiment is formed by a total of transistors including two enhancement-mode p-channel polysilicon MOS transistors and two enhancement-mode n-channel polysilicon MOS transistors, and the level converter circuit has a first stage formed by PMOS M1 and NMOS M3 and a second stage formed by PMOS M2 and NMOS M4.

A source electrode of NMOS M3 of the first stage is connected to the reference voltage VSS (ground potential) and a gate electrode of NMOS M3 is supplied with an input signal φ6 from a input terminal VIN.

The input signal φ6 has an amplitude of VCC, or varies from a voltage higher than VCC to ground potential VSS.

A drain electrode of PMOS M1 is connected to a drain electrode of NMOS M3, and a source electrode and a gate electrode of PMOS M1 are connected to the high voltage VDD and its drain electrode, respectively.

A source electrode of NMOS M4 of the second stage is supplied with the input signal φ6 and a gate electrode of NMOS M4 is connected to a low voltage VCC.

A drain electrode of PMOS M2 is connected to a drain electrode of NMOS M4, and a source electrode and a gate electrode of PMOS M2 are connected to the high voltage VDD and the drain electrode of PMOS M1, respectively. Namely, PMOS M1 forms an active load.

A level-converted output signal φ8 is output from the drain electrode of PMOS M2 of the second stage.

In the level converter circuit of this embodiment, among electrodes of NMOS M3 and M4 of the first and second stages, all the electrodes (i.e., the source and gate electrodes of NMOS M3 and the source and gate electrodes of NMOS M4) except for electrodes connected to an output terminal or a next stage are supplied with the input signal φ6 or a direct-current voltage (the low voltage VCC or ground potential VSS).

Next, the operation of the level converter circuit of this embodiment will be explained.

When the input signal φ6 from the input terminal VIN is at the H level, NMOS M3 is ON, PMOS M1 is ON, NMOS M4 is OFF, PMOS M2 is ON, and therefore the output terminal VOUT outputs the high voltage VDD. When the input signal φ6 is at the L level, NMOS M3 is OFF, PMOS M1 is OFF, NMOS M4 is ON, PMOS M2 is OFF, and therefore the output terminal VOUT outputs the input signal φ6 which is at the L level.

Figure 2:
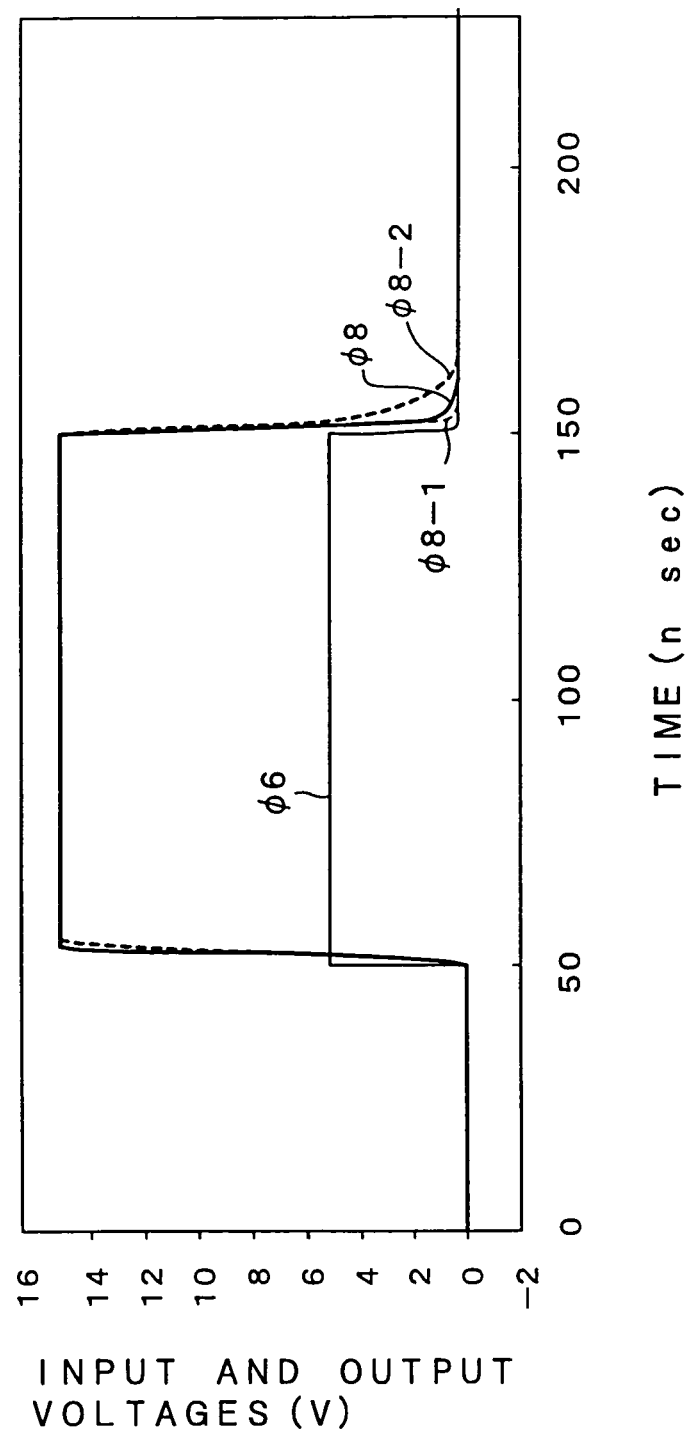
FIG. 2 is an illustration of examples of input and output signal waveforms of the level converter circuit of Embodiment 1 of the present invention.

FIG. 2 is illustrations of examples of waveforms of the input and output signals of the level converter circuit of this embodiment.

FIG. 2 illustrates the waveforms of the input and output signals in a case where polysilicon n-channel MOS transistors having mobility of about 80 cm$^2$/(V·s) are used as NMOS M3 and M4, and polysilicon p-channel MOS transistors having mobility of about 60 cm$^2$/(V·s) are used as PMOS M1 and M2.

In FIG. 2, curve φ8 represents a waveform of an output in a case where NMOS M3, M4 and PMOS M1, M2 have standard threshold voltages VTH, curve φ8-1 represents a waveform of an output in a case where NMOS M3, M4 and PMOS M1, M2 have threshold voltages changed by −1 V, and curve φ8-2 represents a waveform of an output in a case where NMOS M3, M4 and PMOS M1, M2 have threshold voltages changed by +1 V.

Figure 19:
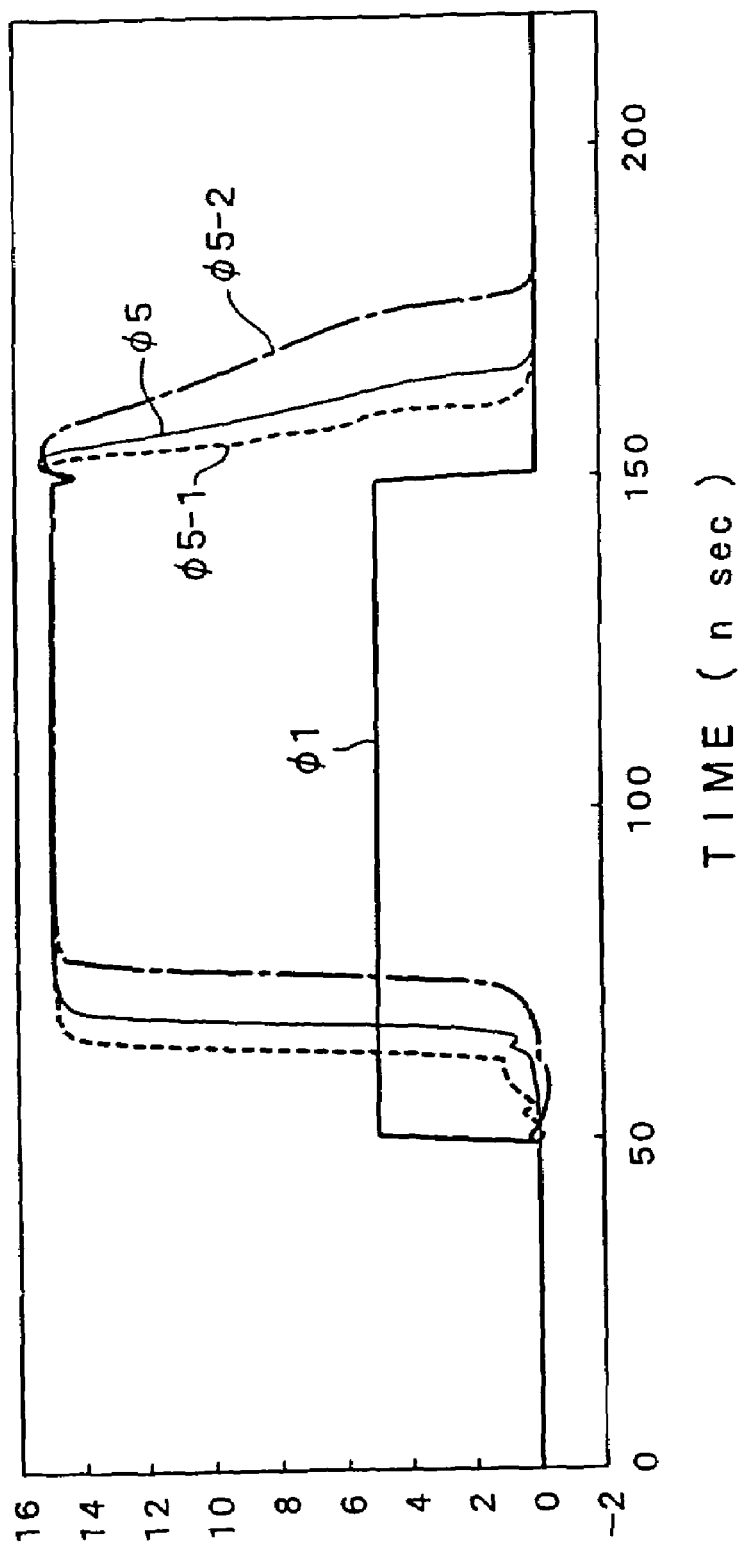
FIG. 19 is an illustration of an example of waveforms of input and output signals of the level converter circuit of FIG. 13 formed by polysilicon n-channel MOS transistors and polysilicon p-channel MOS transistors.
Figure 20:
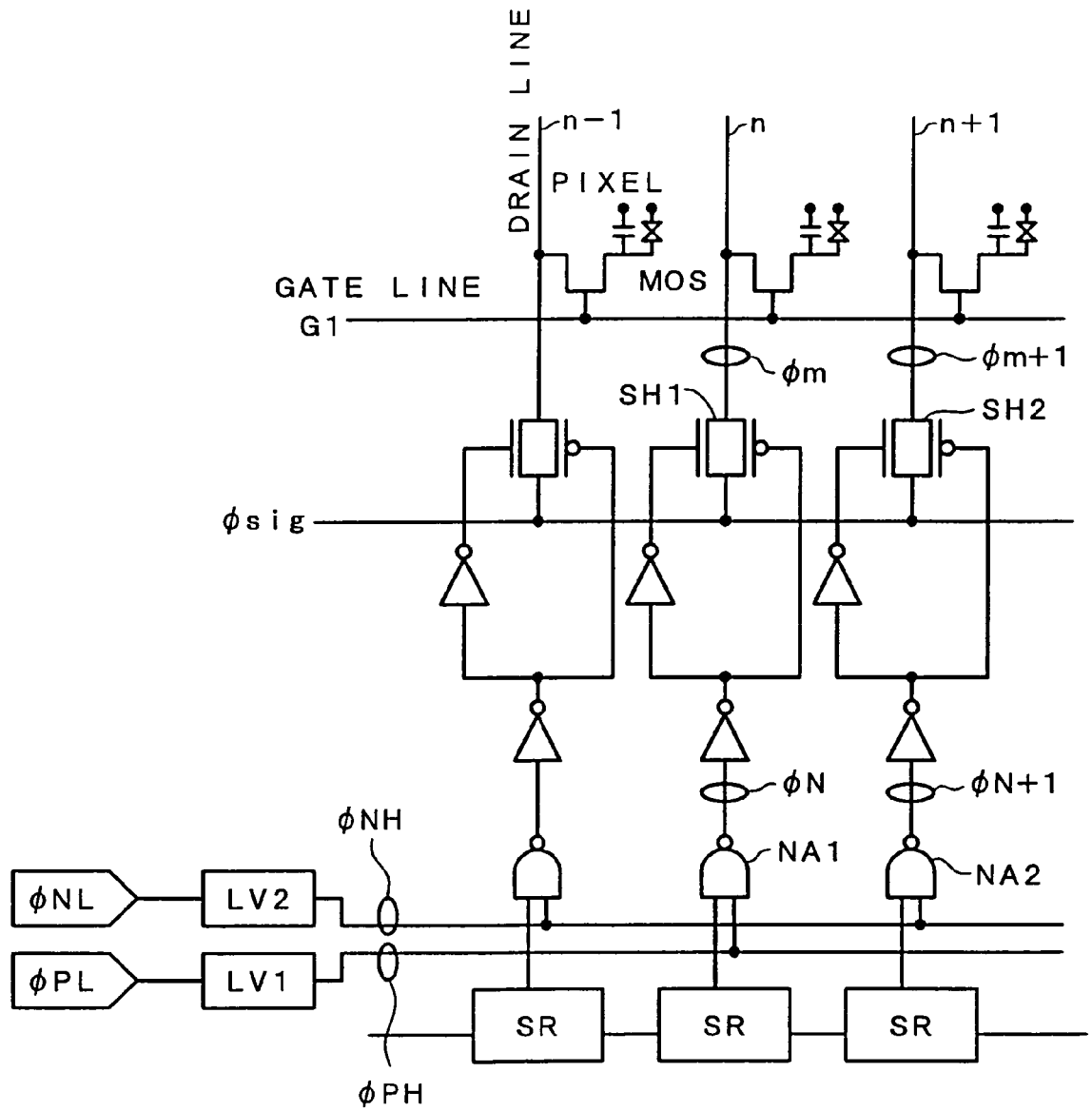
FIG. 20 is an illustration for explaining a principle of displaying by a liquid crystal display module of the active matrix type using polysilicon MOS transistors.
Figure 21:
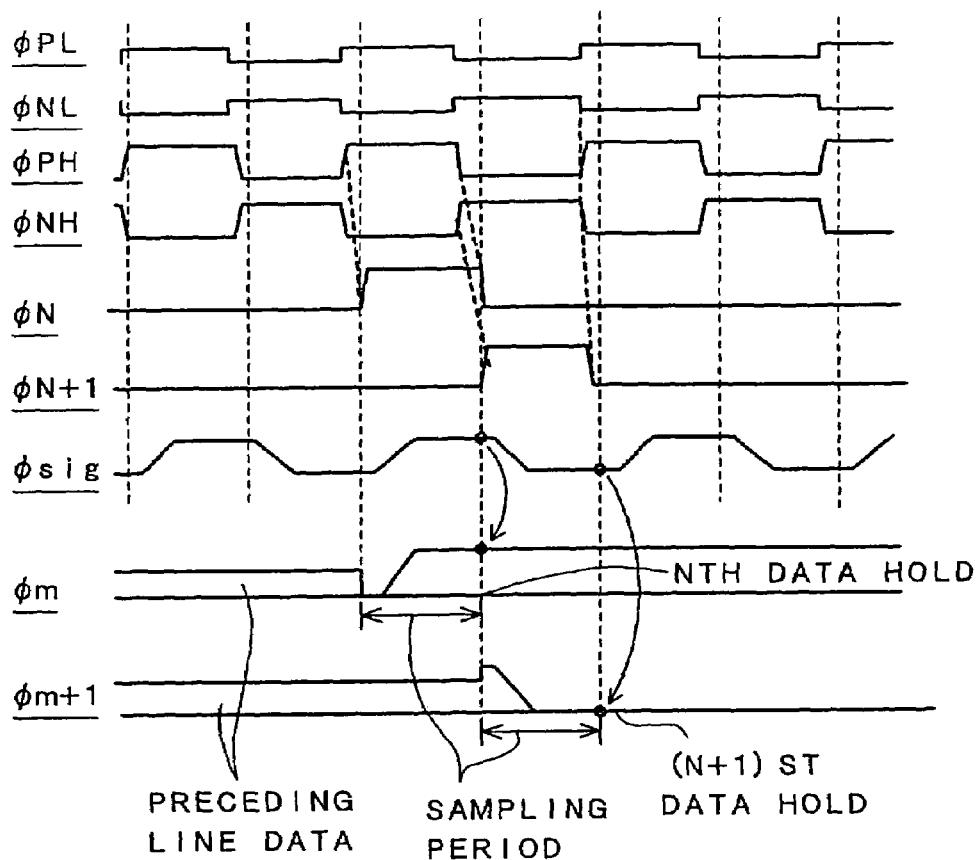
FIG. 21 is timing charts for explaining the operation of sampling analog video signals φsig to be supplied to a drain electrode line in FIG. 20.

As is apparent from FIG. 2, the level converter circuit of this embodiment provides comparatively stable input and output characteristics irrespective of the variations of the threshold voltages VTH of NMOS M3, M4 and PMOS M1, M2, compared with the waveforms of the input and output characteristics shown in FIG. 19.

Figure 16:
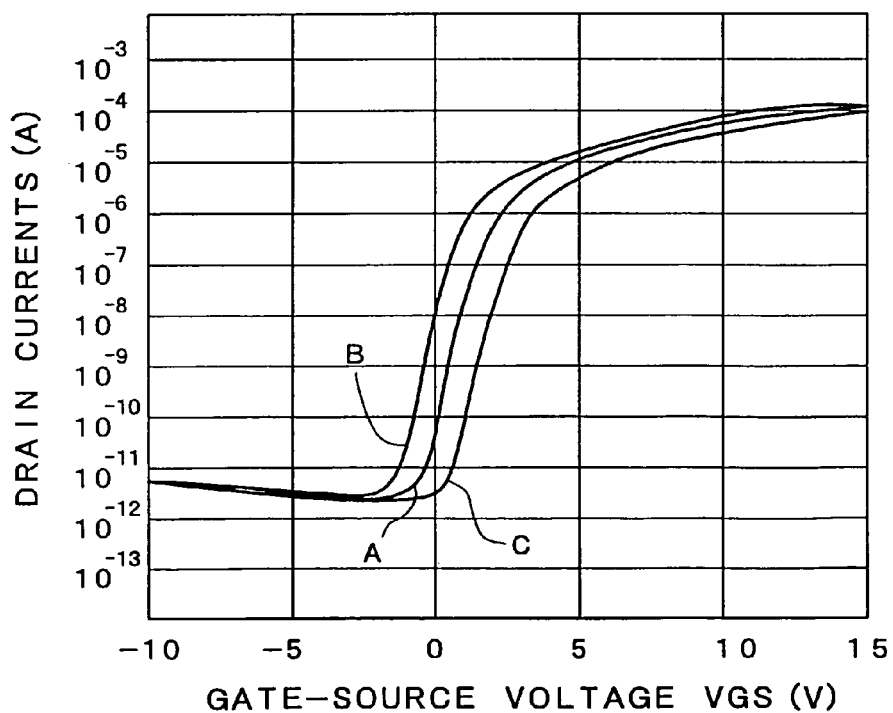
FIG. 16 is a graph showing an example of switching characteristics of a MOS transistor having a semiconductor layer made of polysilicon.
Figure 17:
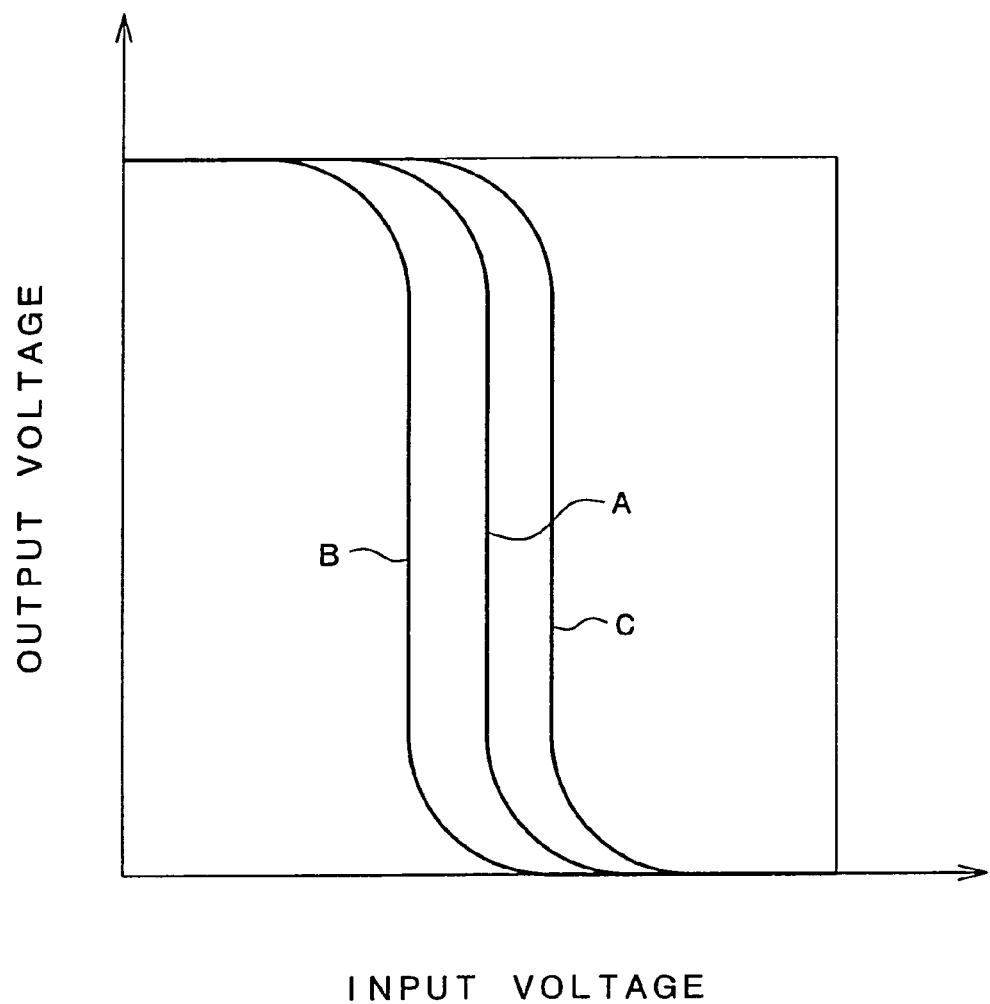
FIG. 17 is a graph showing DC transfer characteristics of a CMOS inverter.

As described above, the threshold voltages VTH of the polysilicon MOS transistors vary greatly, and as shown in FIG. 16, when the supply voltage is low, the drain currents ID vary greatly with the variations of the threshold voltages VTH of the MOS transistors.

However, in the level converter circuit of this embodiment, the external signal φ6 is applied to the gate electrode of NMOS M3 and the source electrode of NMOS M4 directly from the input terminal VIN, and as a result, even if the threshold voltages VTH of the polysilicon MOS transistors vary, the drain currents ID do not vary much.

Consequently, the level converter circuit of this embodiment can prevent the delay time of the output signal and the duration of the H level of the output signal from varying greatly with the variations of the threshold voltages VTH of the transistors NMOS M3, M4 and PMOS M1, M2 forming the level converter circuit.

Figure 13:
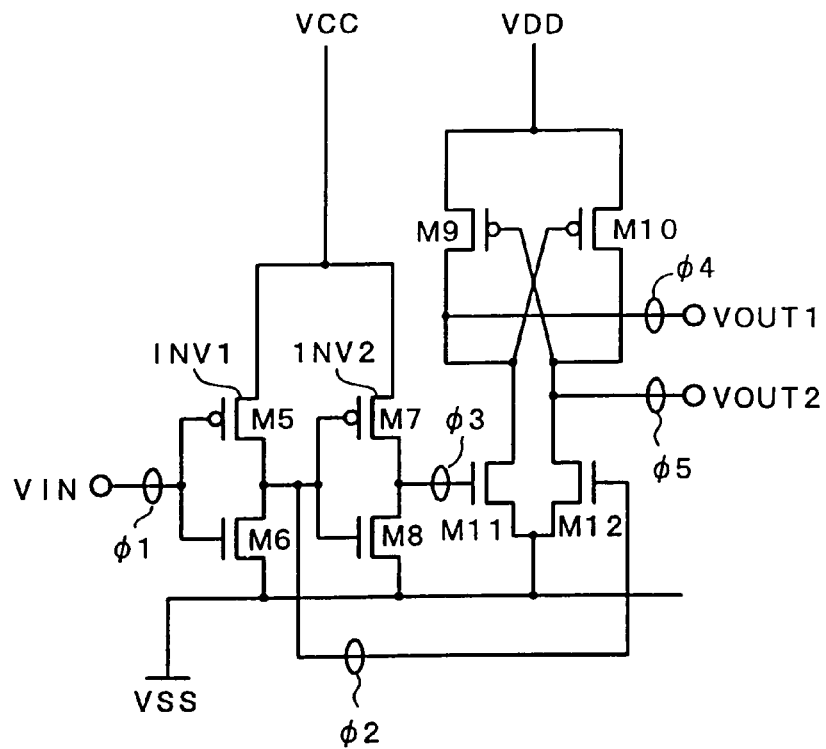
FIG. 13 is a circuit diagram of an example of a prior art level converter circuit.
Figure 15:
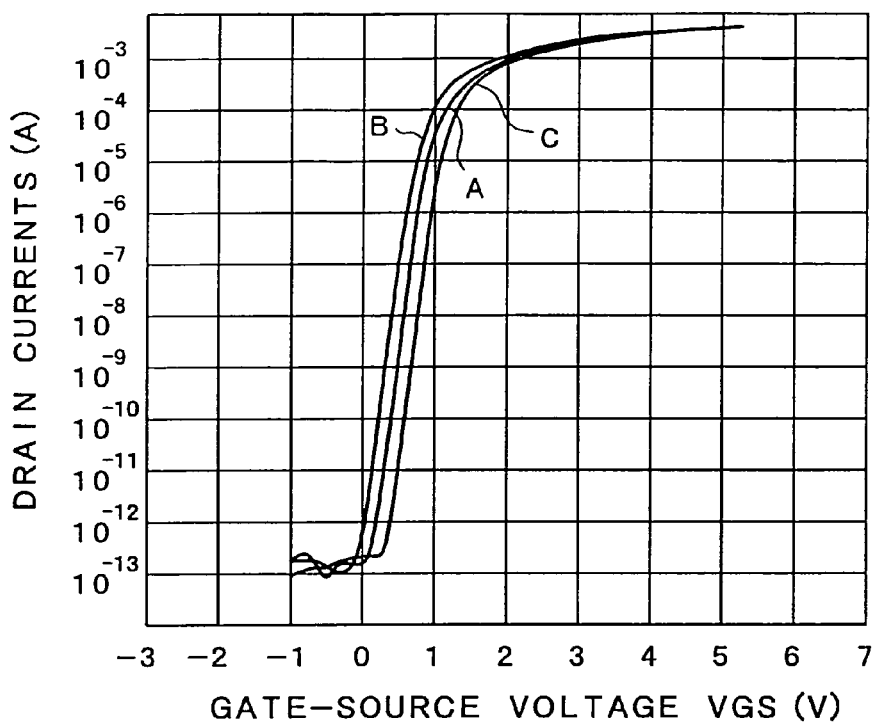
FIG. 15 is a graph showing an example of switching characteristics of a n-channel MOS transistor having a semiconductor made of single crystal silicon.

Incidentally, the advantages of this embodiment are obtained in a level converter circuit using transistors having single-crystal semiconductor layers. However, as shown in FIG. 15, the threshold voltages VTH of the MOS transistors having a single-crystal semiconductor layer do not vary much, and a large amount of the drain currents can be obtained, and consequently, it is common sense to use a conventional circuit shown in FIG. 13 for the purpose of low power consumption. Therefore no one has thought of the level converter circuit of this embodiment shown in FIG. 1, because there is a disadvantage of increase of power consumption.

FIGS. 3 to 7 are circuit diagrams for illustrating modifications of the level converter circuit of the embodiment of the present invention.

Figure 3:
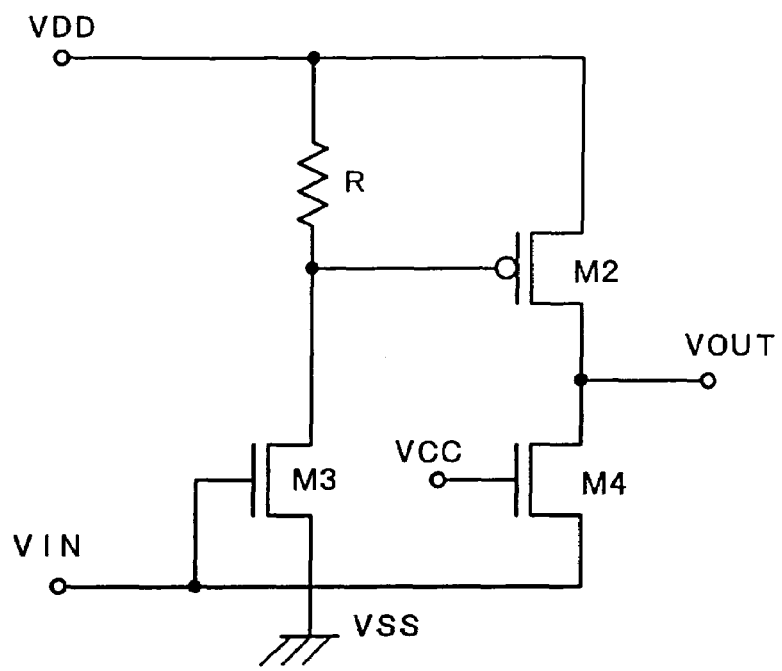
FIG. 3 is a circuit diagram of a modification of the level converter circuit of Embodiment 1 of the present invention.

A level converter circuit shown in FIG. 3 uses a resistor element as a load of its first stage. In the level converter circuit of FIG. 3, the same polysilicon film and wiring electrodes as those of the thin film transistors (TFTs) can be used for the resistor element, and as a result, the level converter circuit can be fabricated simply and manufactured easily.

Figure 4:
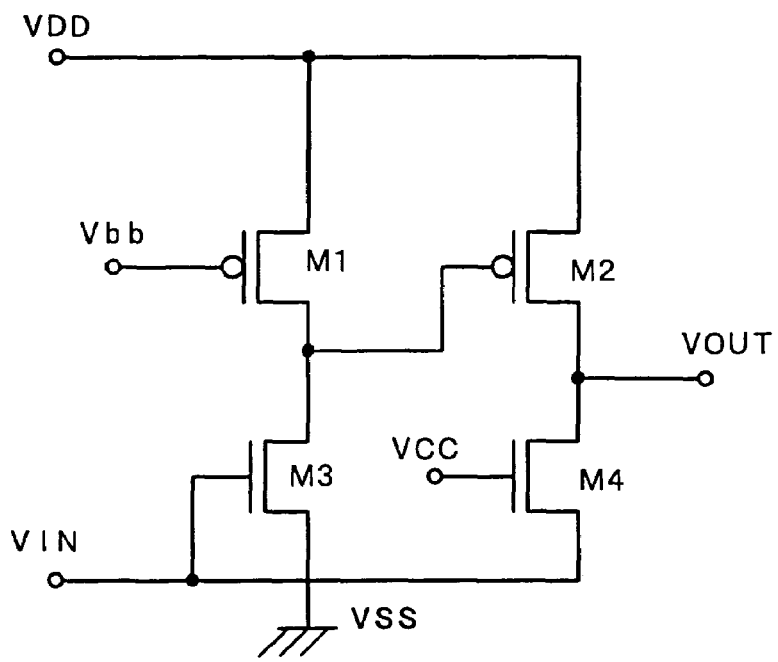
FIG. 4 is a circuit diagram of another modification of the level converter circuit of Embodiment 1 of the present invention.

A level converter circuit shown in FIG. 4 uses as a load of its first stage a polysilicon PMOS M1 a gate electrode of which is supplied with a specified bias supply voltage Vbb. In the level converter circuit of FIG. 4, a current flowing through NMOS M3 is limited by PMOS M1, and consequently, its power consumption is suppressed. The limit of the current is determined by the bias supply voltage Vbb.

Figure 5:
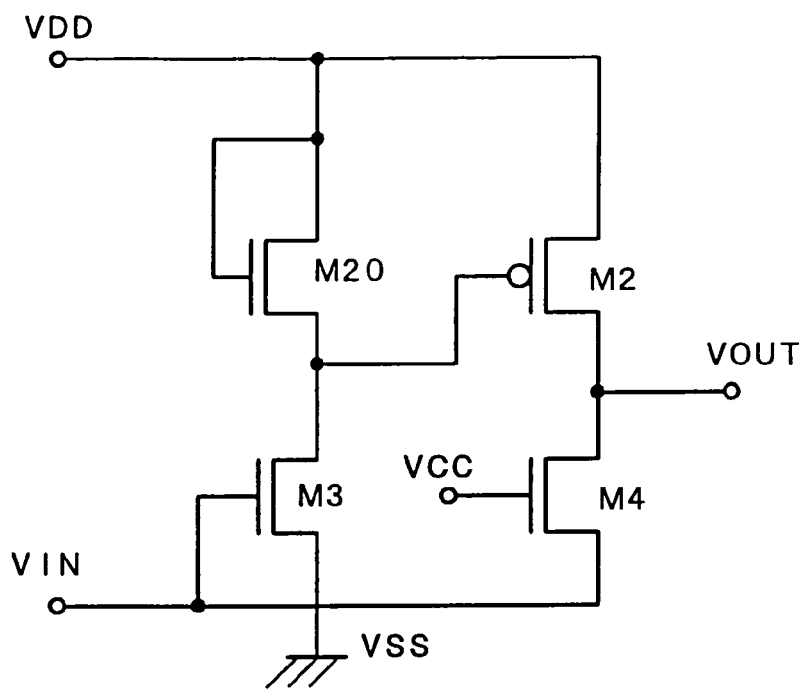
FIG. 5 is a circuit diagram of still another modification of the level converter circuit of Embodiment 1 of the present invention.

A level converter circuit shown in FIG. 5 uses as a load of its first stage an active load formed by a polysilicon NMOS M20. In the level converter circuit of FIG. 5, an input stage is formed only by MOS transistors of NMOS M3 and M20, and the NMOS transistors have higher mobility than PMOS transistors and therefore the level converter circuit operates with greater speed.

Figure 6:
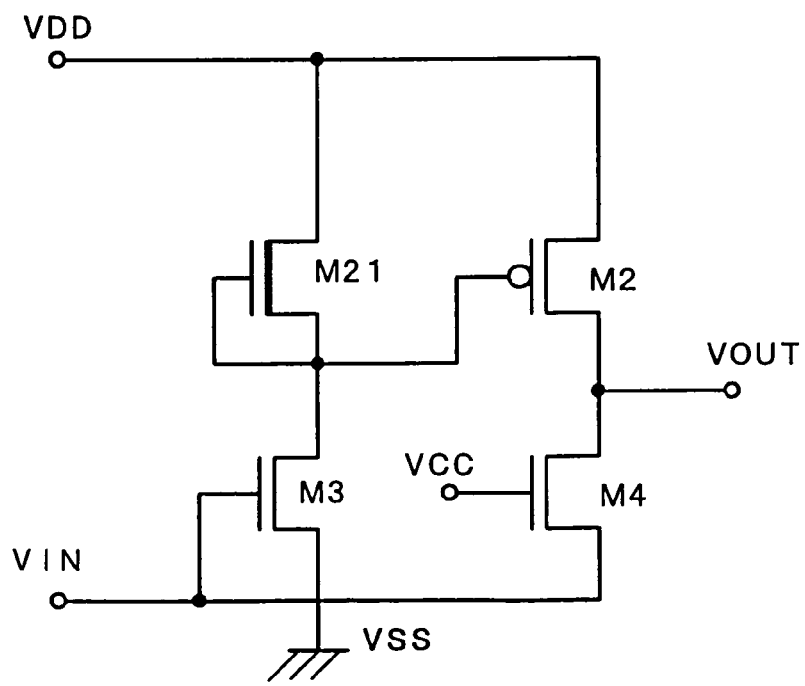
FIG. 6 is a circuit diagram of still another modification of the level converter circuit of Embodiment 1 of the present invention.

A level converter circuit shown in FIG. 6 uses as a load of its first stage an active load formed by a depletion-mode polysilicon NMOS M21. In the level converter circuit of FIG. 6, NMOS M21 is a depletion-mode MOS transistor, and it can flow a current therethrough at all times and therefore the level converter circuit operates with greater speed, but the power consumption is increased accordingly.

Figure 7:
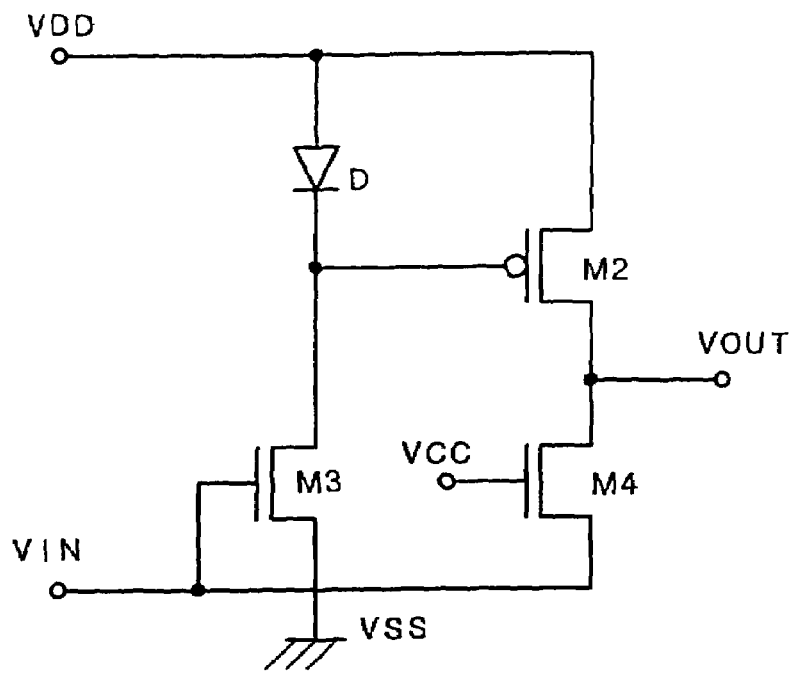
FIG. 7 is a circuit diagram of still another modification of the level converter circuit of Embodiment 1 of the present invention.

A level converter circuit shown in FIG. 7 uses a diode D as a load of its first stage. The diode D is fabricated by doping the same polysilicon film as that of the thin film transistors (TFT) with impurities for forming a p-type region and an n-type region, respectively, and therefore the level converter circuit of FIG. 7 facilitates its manufacturing process.

The level converter circuits shown in FIGS. 3 to 7 are capable of providing the advantages similar to those provided by the level converter circuit of FIG. 1.

Embodiment 2

Figure 8:
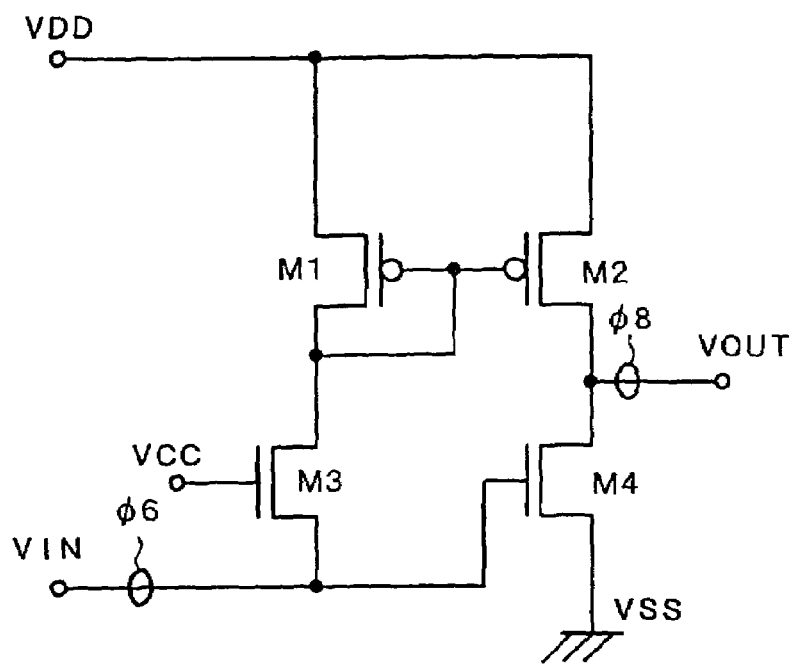
FIG. 8 is a circuit diagram of a level converter circuit of Embodiment 2 of the present invention.

FIG. 8 is a circuit diagram of a level converter circuit of Embodiment 2 of the present invention.

As shown in FIG. 8, the level converter circuit of this embodiment also uses a total of four enhancement-mode transistors including two p-channel polysilicon MOS transistors and two n-channel polysilicon MOS transistors, and has the first stage formed by PMOS M1 and NMOS M3 and the second stage formed by PMOS M2 and NMOS M4.

The level converter circuit of this embodiment differs from that of Embodiment 1, in that a source electrode of NMOS M3 of the first stage is supplied with the input signal φ6, a gate electrode of NMOS M3 is connected to the low voltage VCC, a source electrode of NMOS M4 of the second stage is connected to the reference voltage VSS and a gate electrode of NMOS M4 is supplied with the input signal φ6 from the input terminal VIN.

In the level converter circuit of this embodiment, when the input signal φ6 from the input terminal VIN is at the H level, NMOS M3 is OFF, PMOS M1 is OFF, NMOS M4 is ON, PMOS M2 is OFF, and therefore the output terminal VOUT outputs ground potential VSS.

Next, when the input signal φ6 is at the L level, NMOS M3 is ON, PMOS M1 is ON, NMOS M4 is OFF, PMOS M2 is ON, and therefore the output terminal VOUT outputs the high voltage VDD.

While, in the level converter circuit of Embodiment 1, the level-converted output signal φ8 is in the same phase with the input signal φ6, the level-converted output signal φ8 of the level converter circuit of this embodiment is in the phase opposite from the input signal φ6.

The level converter circuit of this embodiment also provides the advantages similar to those provided by the level converter circuit of Embodiment 1, and the level converter circuit of Embodiment 2 may use one of the loads represented in FIGS. 3 to 7, as the load of the first stage which is formed by PMOS M1.

Figure 22:
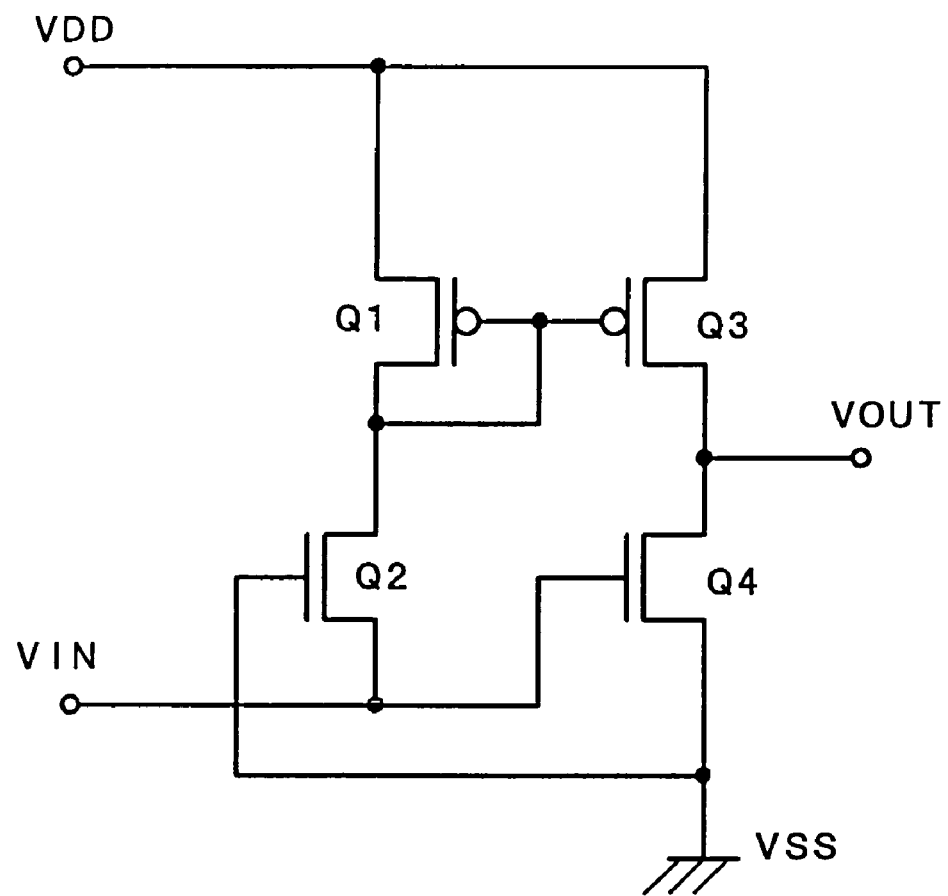
FIG. 22 is a circuit diagram of a prior art buffer circuit.

A buffer circuit similar to the level converter circuit of Embodiment 2 is disclosed in Japanese Patent Application Laid-open No. Hei 7-7414 (laid-open on Jan. 10, 1995). FIG. 22 is a circuit diagram of the buffer circuit disclosed in Japanese Patent Application Laid-open No. Hei 7-7414.

Only the voltage VDD and the reference voltage VSS are supplied to the buffer circuit of FIG. 22 including PMOS Q1 and NMOS Q2 so as to perform a function of the buffer circuit. NMOS Q2 is supplied with a signal having an amplitude varying between the voltage VDD and ground potential VSS, and consequentially, a depletion-mode n-channel MOS transistor is used as NMOS Q2.

In the first place, the buffer circuit of FIG. 22 is not a level converter circuit for shifting a voltage level of an input signal, and it differs from the level converter circuit of Embodiment 2 in that the depletion-mode n-channel MOS transistor, NMOS Q2, is used.

Further, Japanese Patent Application Laid-open No. Hei 7-7414 does not disclose a technique for preventing the delay time of the output signal and the duration of the H level of the output signal from varying greatly with variations of the threshold voltages VTH of the transistors NMOS M3, M4 and PMOS M1, M2 of the level converter circuit of Embodiment 2 shown in FIG. 8.

Embodiment 3

Figure 9:
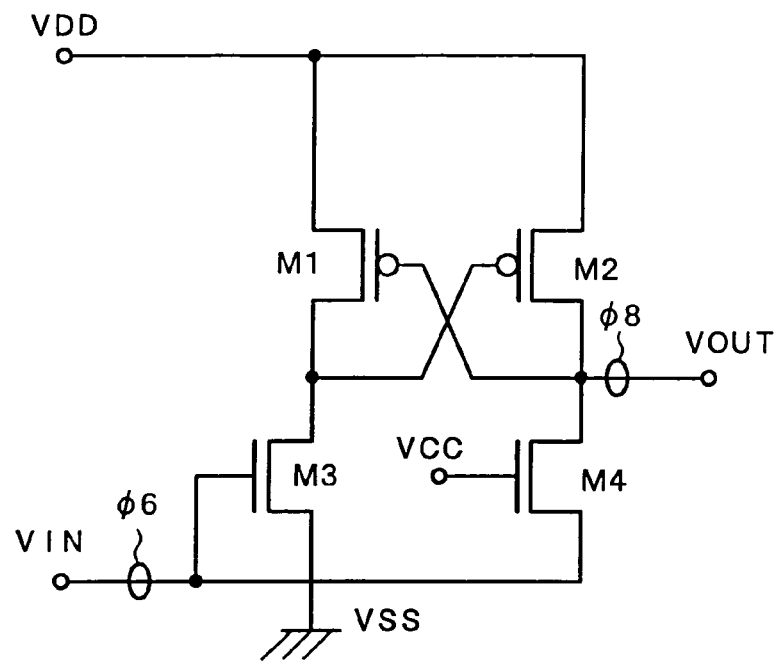
FIG. 9 is a circuit diagram of a level converter circuit of Embodiment 3 of the present invention.

FIG. 9 is a circuit diagram of a level converter circuit of Embodiment 3 of the present invention.

As shown in FIG. 9, the level converter circuit of this embodiment also uses a total of four enhancement-mode transistors including two p-channel polysilicon MOS transistors and two n-channel polysilicon MOS transistors, and has the first stage formed by PMOS M1 and NMOS M3 and the second stage formed by PMOS M2 and NMOS M4.

The level converter circuit of this embodiment differs from that of Embodiment 1, in that a gate electrode of PMOS M1 of the first stage is connected to a drain electrode (i.e., the output terminal VOUT) of PMOS M2 of the second stage.

In the level converter circuit of this embodiment, when the input signal φ6 from the input terminal VIN is at the H level, NMOS M3 is ON, PMOS M1 is OFF, NMOS M4 is OFF, PMOS M2 is ON, and therefore the output terminal VOUT outputs the high voltage VDD.

Next, when the input signal φ6 is at the L level, NMOS M3 is OFF, PMOS M1 is ON, NMOS M4 is ON, PMOS M2 is OFF, and therefore the output terminal VOUT outputs the input signal φ6 which is the low voltage.

In this way, in the level converter circuit of this embodiment, the level-converted output signal φ8 is in the same phase with the input signal φ6 as in the case of Embodiment 1.

The level converter circuit of this embodiment also provides the advantages similar to those provided by the level converter circuit of Embodiment 1.

In the level converter circuit of this embodiment, as shown in FIG. 9, both NMOS M3 and PMOS M1 are not ON at the same time, both NMOS M4 and PMOS M2 are not ON at the same time, and consequently any currents do not flow except for switching times in the first and second stages and power consumption is reduced.

However, the level converter circuit of Embodiment 1 shown in FIG. 1 has an advantage of higher speed operation than this embodiment.

Figure 14:
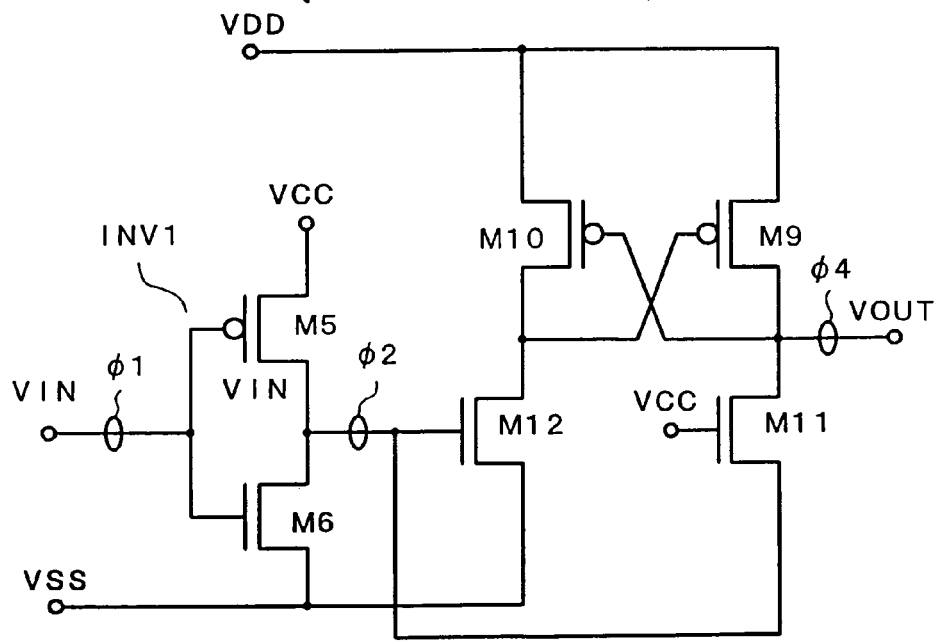
FIG. 14 is a circuit diagram of another example of a prior art level converter circuit.

The level converter circuit of this embodiment differs from the level converter circuit of FIG. 14, in that the external signal φ 6 from the external terminal VIN is applied directly to the gate electrode of NMOS M3 and the source electrode of NMOS M4.

As described above, threshold voltages VTH of polysilicon MOS transistors vary greatly, and if the supply voltage is low, drain currents ID vary greatly with the variations of the threshold voltages VTH of the MOS transistors. Therefore, if the level converter circuit of FIG. 14 is formed by polysilicon MOS transistors, there has been a problem in that the variations of a delay time (or a phase difference) of the output signal with respect to the input signal and a duration of the H level (or a duration of the L level) become great mainly due to the threshold voltages VTH of the polysilicon MOS transistors forming the CMOS inverter INV1.

On the other hand, in the level converter circuit of this embodiment, the gate electrode of NMOS M3 and the source electrode of NMOS M4 have the external signal φ6 applied directly from the external terminal VIN, and consequently, a delay time of the output signal and a duration of the H level of the output signal are prevented from varying greatly with the variations of the threshold voltages VTH of the transistors, NMOS M3, M4 and PMOS M1, M2, forming the level converter circuit.

Embodiment 4

Figure 10:
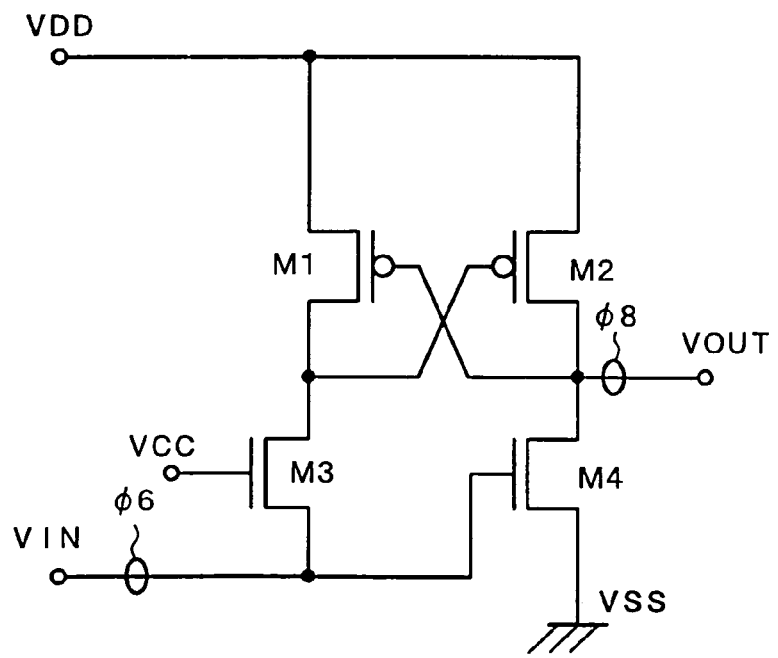
FIG. 10 is a circuit diagram of a level converter circuit of Embodiment 4 of the present invention.

FIG. 10 is a circuit diagram of a level converter circuit of Embodiment 4 of the present invention.

As shown in FIG. 10, the level converter circuit of this embodiment also uses a total of four enhancement-mode transistors including two p-channel polysilicon MOS transistors and two n-channel polysilicon MOS transistors, and has the first stage formed by PMOS M1 and NMOS M3 and the second stage formed by PMOS M2 and NMOS M4.

The level converter circuit of this embodiment differs from that of Embodiment 2, in that a gate electrode of NMOS M1 of the first stage is connected to a drain electrode (i.e., the output terminal VOUT) of PMOS M2 of the second stage.

In the level converter circuit of this embodiment, when the input signal φ6 from the input terminal VIN is at the H level, NMOS M3 is OFF, PMOS M1 is ON, NMOS M4 is ON, PMOS M2 is OFF, and therefore the output terminal VOUT outputs ground potential VSS.

Next, when the input signal φ6 is at the L level, NMOS M3 is ON, PMOS M1 is OFF, NMOS M4 is OFF, PMOS M2 is ON, and therefore the output terminal VOUT outputs the high voltage VDD.

In this way, in the level converter circuit of this embodiment, the level-converted output signal φ8 is in the phase opposite from the input signal φ6, as in the case of Embodiment 2.

As in the case of the level converter circuit of Embodiment 3, in the level converter circuit of this embodiment also, currents flow in the circuits of the first and second stages only during switching times, and power consumption is reduced.

However, the level converter circuit of Embodiment 1 shown in FIG. 1 has an advantage of higher speed operation than this embodiment.

Embodiment 5

Figure 11:
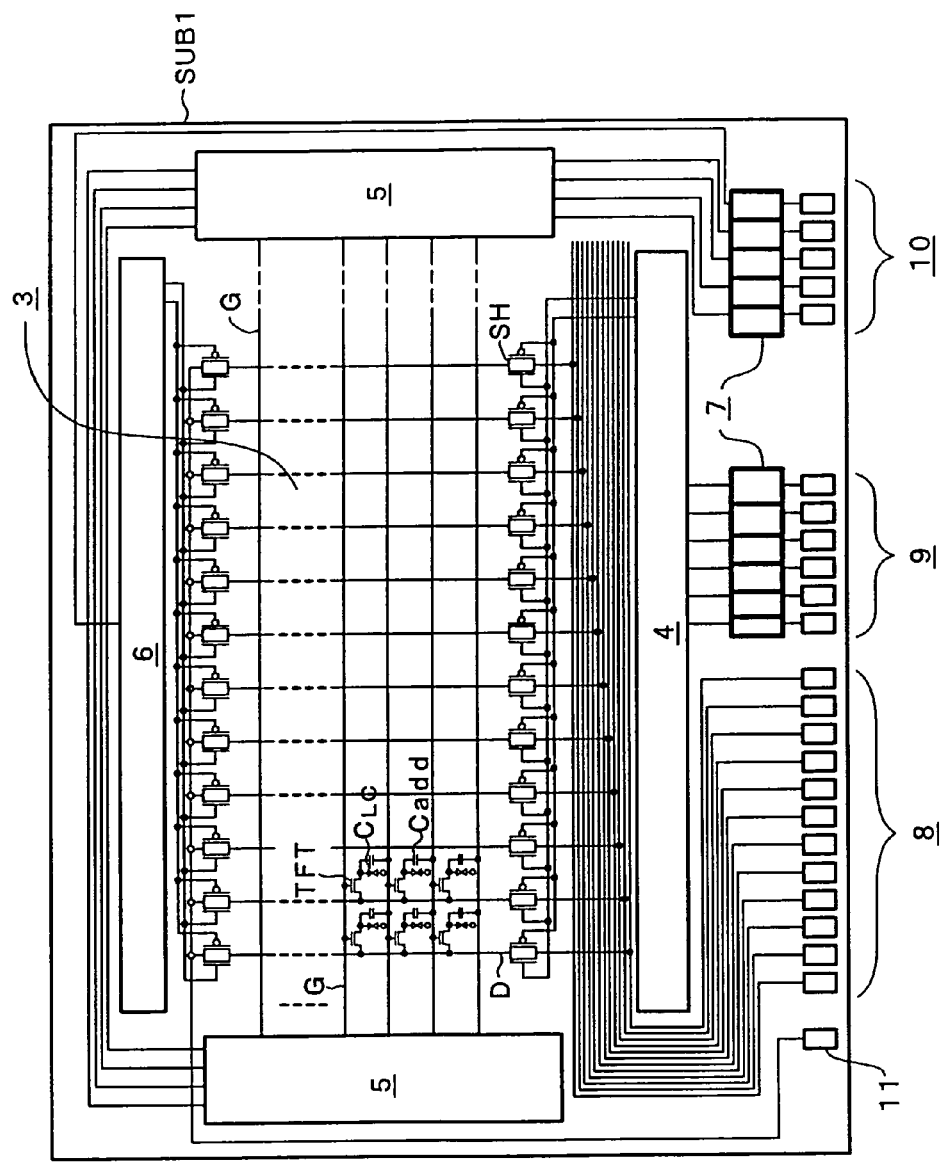
FIG. 11 is a block diagram representing a configuration of a display panel of an active-matrix type liquid crystal display module of the analog-sampling type using polysilicon MOS transistors in accordance with Embodiment 5 of the present invention.

FIG. 11 is a block diagram representing a configuration of a display panel of an active-matrix type liquid crystal display module of the analog sampling type using polysilicon MOS transistors in accordance with Embodiment 5 of the present invention.

In FIG. 11, reference character SUB1 denotes a transparent insulating substrate made of glass having a softening temperature not higher than 800° C. or quartz glass, reference numeral 3 denotes a display area having a plurality of pixels arranged in a matrix fashion and each pixel is provided with a polysilicon thin film transistor (TFT).

Each pixel is disposed in an area surrounded by two adjacent drain electrode lines D and two adjacent gate electrode lines G.

Each pixel has a thin film transistor TFT, a source electrode of which is connected to a pixel electrode (not shown). A liquid crystal layer is disposed between each pixel electrode and a common electrode (not shown) opposing all the pixel electrodes, and therefore a capacitor CLC formed by the liquid crystal layer is connected between the source electrode of the thin film transistor TFT and the common electrode in an electrical equivalent circuit.

An additional capacitance CADD is connected between the source electrode of the thin film transistor TFT and an immediately preceding gate electrode line G.

All the gate electrodes of thin film transistors TFT in the same row among the thin film transistors TFT arranged in a matrix fashion are connected to one of the gate electrode lines G, and each of the gate electrode lines G is connected to vertical scanning circuits 5 disposed on opposite sides of the display area 3.

All the drain electrodes of thin film transistors TFT in the same column among the thin film transistors TFT arranged in the matrix fashion are connected to one of the drain electrode lines D, and each of the drain electrode lines D is connected to a horizontal scanning circuit 4 disposed below the display area 3. Each of the drain electrode lines D is also connected to a precharge circuit 6 disposed above the display area 3.

Voltage levels of control signals input via control signal input terminals 9, 10 are level-shifted by level converter circuits 7 in accordance with one of the above embodiments, and are supplied to the horizontal scanning circuit 4, the vertical scanning circuit 5 and the precharge circuit 6. In this embodiment, the polysilicon MOS transistors forming the level converter circuits 7 are fabricated on the transparent insulating substrate SUB1 simultaneously with the thin film transistors TFT of the pixels.

In this embodiment, the liquid crystal display panel has incorporated therein the level converter circuits for converting signals (generally 0 to 5 V, 0 to 3.5 V or 0 to 3 V) input from an external circuit into signals of amplitudes (generally high voltages) sufficient to drive the liquid crystal display panel and the circuits formed by polysilicon MOS transistors. Therefore, the present embodiment makes it possible to drive the liquid crystal display panel with output signals from standard logic ICs.

In the liquid crystal display module using polysilicon MOS transistors, of this Embodiment also, the first gate electrode line G1, for example, is selected by the vertical scanning circuit 5 during one horizontal scanning period, and during this period the horizontal scanning circuit 4 outputs sampling pulses to drive a sample-and-hold circuit SH (not shown) such that analog video signals supplied from video signal input terminals 8 are supplied to each of the drain electrode lines D.

In this embodiment, the analog video signals whose frequencies are divided by 12 are supplied from the video signal input terminals 8, and therefore with one sampling pulse, analog video signals are supplied to twelve drain electrode lines D, respectively.

Further, within a retrace time of one horizontal scanning period, the precharge circuit 6 supplies a precharge voltage input from a precharge voltage input terminal 11 to each of the drain electrode lines D.

In this embodiment, one of the level converter circuits of the embodiments of the present invention is used as the level converter circuit 7, and therefore this circuit reduces variations of phases of the sampling pulses and durations of the H level supplied from the horizontal scanning circuit 4, even if variations occur in the threshold voltages VTH of the polysilicon MOS transistors forming the level converter circuit.

Consequently, this embodiment prevent occurrence of a ghost in an image displayed on the liquid crystal display panel, and improves the quality of the displayed image compared with that obtained by the prior art.

Figure 12:
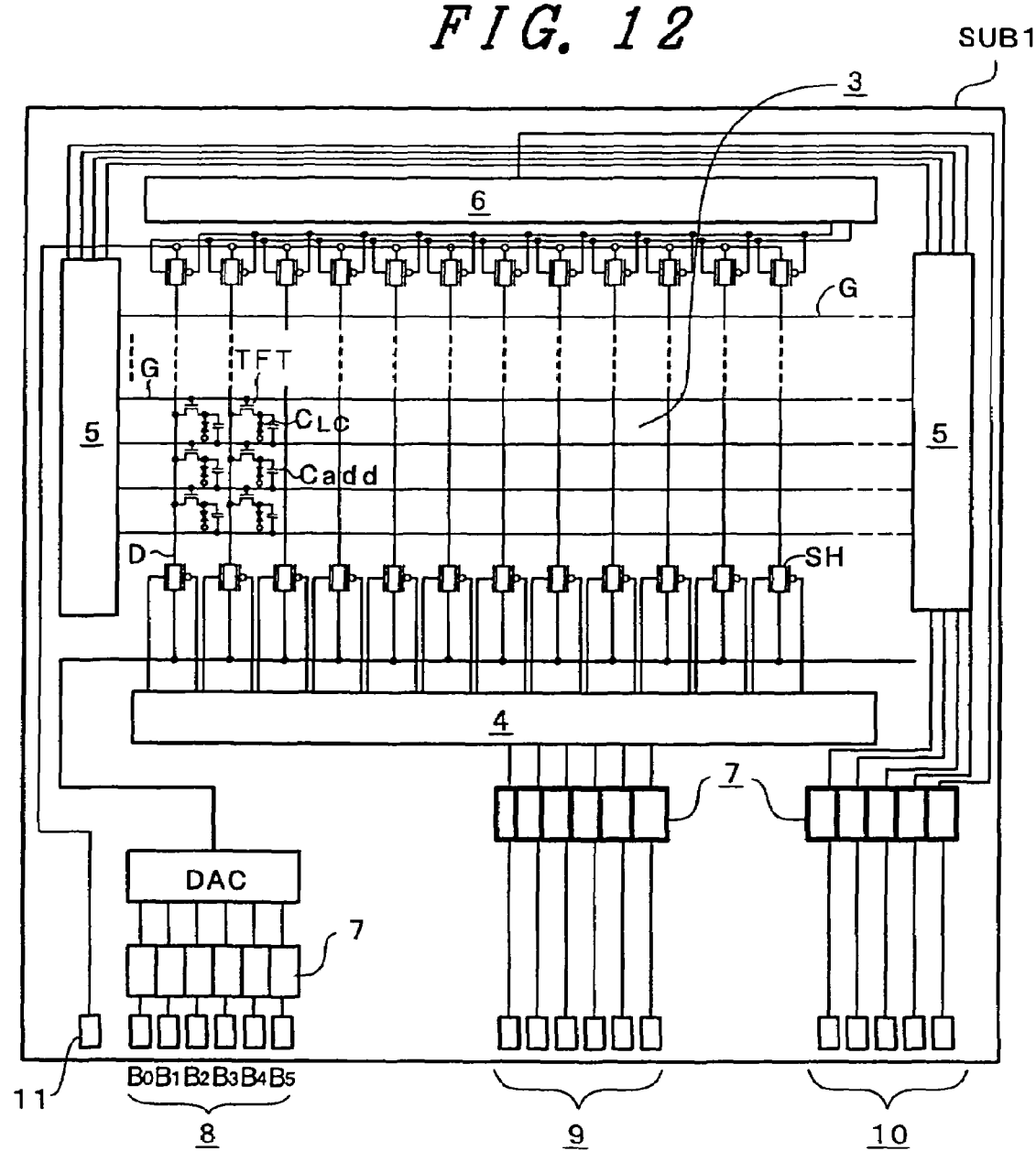
FIG. 12 is a block diagram representing a configuration of a display panel of a liquid crystal display module of the digital-signal-input active-matrix type using polysilicon MOS transistors in accordance with Embodiment 5 of the present invention.

The present invention is not limited to the liquid crystal display module of the analog-sampling active-matrix type using polysilicon mos transistors, but is also applicable to a liquid crystal display module of the digital-signal-input active-matrix type using polysilicon MOS transistors shown in FIG. 12.

The liquid crystal display module of the digital-signal-input active-matrix type using polysilicon MOS transistors shown in FIG. 12 is the same as the liquid crystal display module of the analog-sampling active-matrix type using polysilicon MOS transistors shown in FIG. 11, except that the liquid crystal display module of the digital-signal-input active-matrix type is provided with a D/A converter DAC connected to the video signal input terminals 8.

The D/A converter DAC of the liquid crystal display module of FIG. 12 is also comprised of polysilicon thin film transistors fabricated simultaneously with the thin film transistors TFT forming pixels, and therefore digital video signals can be input directly into the liquid crystal display panel.

Further, level converter circuits 7 in accordance with one of the above-described embodiments are provided between the D/A converter DAC and the video signal input terminals 8, and therefore output signals from standard logic ICs can be input directly to the video signal input terminals 8.

In the level converter circuit 7 formed by polysilicon thin film transistors in accordance with one of the above-described embodiments, delay times vary little with the variations of threshold voltages VTH of the polysilicon MOS transistors, and a portion of data is not inverted in the D/A converter DAC and therefore defective displays do not occur.

The inventions made by the present inventors have been explained concretely based upon the above embodiments, but the present inventions are not limited to the above embodiments and it will be obvious to those skilled in the art that various changes and modifications may be made therein without departing from the spirit and scope of the present inventions. For example, the active-matrix display panel shown in FIG. 11 can be used for an electroluminescent (EL) display device.

The following explains briefly advantages obtained by representative ones of the inventions disclosed in this specification.

(1) The level converter circuits of the present invention can reduce the total number of transistors required for the level converter circuit.

(2) The level converter circuits of the present invention can reduce influences due to variations of threshold voltages of transistors forming the level converter circuit.

(3) The liquid crystal display device of the present invention can improve the quality of images displayed on its display panel.

What is claimed is:

1. A display device comprising a plurality of pixels and a driver circuit for supplying a signal to said plurality of pixels, wherein said driver circuit includes a plurality of level converter circuits, each of said plurality of level converter circuits comprises:

an input terminal adapted to be supplied with a signal swinging between a first voltage and a second voltage lower than said first voltage;

an output terminal for outputting a signal swinging between a third voltage higher than said first voltage and said second voltage;

a first transistor of a first conductivity type;

a second transistor of a second conductivity type;

a third transistor of said first conductivity type; and
a load circuit;
wherein said input terminal is coupled to a gate electrode of said first transistor and a source region of said third transistor,
said output terminal is coupled to a source region of said second transistor and a drain region of said third transistor,
a drain region of said first transistor is coupled to a gate electrode of said second transistor,
a source region of said first transistor is coupled to ground potential,
a drain region of said second transistor is coupled to a power supply line for supplying said third voltage,
a gate electrode of said third transistor is supplied with a dc voltage higher than said second voltage and equal to or lower than said first voltage,
said load circuit is coupled between said gate electrode of said second transistor and said power supply line, and
wherein said output terminal outputs said third voltage higher than said second voltage when said input terminal is supplied with said first voltage, and said output terminal outputs said second voltage when said input terminal is supplied with said second voltage.

2. A display device according to claim 1, wherein a semiconductor layer of said first transistor is made of polysilicon.

3. A display device according to claim 1, wherein said load circuit is formed of a transistor of said second conductivity type.

4. A display device according to claim 1, wherein each of said plurality of pixels is provided with a transistor of said second conductivity type.

5. A display device according to claim 1, wherein said display device is a liquid crystal display device.

* * * * *